(12) United States Patent
Manning

(10) Patent No.: US 6,445,044 B2
(45) Date of Patent: *Sep. 3, 2002

(54) APPARATUS IMPROVING LATCHUP IMMUNITY IN A DUAL-POLYSILICON GATE

(75) Inventor: Monte Manning, Kuna, ID (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/126,182

(22) Filed: Jul. 30, 1998

Related U.S. Application Data

(60) Continuation of application No. 08/762,741, filed on Dec. 10, 1996, now Pat. No. 5,801,423, which is a continuation of application No. 08/390,605, filed on Feb. 17, 1995, now abandoned, which is a division of application No. 08/106,179, filed on Aug. 13, 1993, now Pat. No. 5,420,061.

(51) Int. Cl.$^7$ .............................................. H01L 29/78
(52) U.S. Cl. ........................ 257/372; 257/372; 257/376; 257/510
(58) Field of Search ................... 257/372, 374, 257/376, 510

(56) References Cited

U.S. PATENT DOCUMENTS

| | | |
|---|---|---|
| 4,503,451 A | 3/1985 | Lund et al. ............... 257/374 |
| 4,661,202 A | 4/1987 | Ochii ....................... 437/63 |
| 4,713,358 A | 12/1987 | Bulat et al. ............... 437/65 |
| 4,786,960 A | 11/1988 | Jeuch ...................... 257/374 |
| 4,805,008 A | 2/1989 | Yao et al. ................. 257/376 |
| 4,819,052 A * | 4/1989 | Hutter ..................... 257/378 |
| 4,826,781 A | 5/1989 | Asahina et al. ............ 437/41 |
| 4,826,783 A | 5/1989 | Choi et al. ................ 437/57 |
| 4,876,213 A | 10/1989 | Pfiester ................... 437/34 |
| 4,925,806 A | 5/1990 | Grosse .................... 437/34 |
| 4,926,233 A | 5/1990 | Hutter ..................... 257/374 |
| 4,929,565 A | 5/1990 | Parrillo ................... 437/34 |
| 4,980,306 A | 12/1990 | Shimbo .................... 437/34 |
| 5,032,530 A | 7/1991 | Lowrey et al. ............. 437/34 |
| 5,110,749 A | 5/1992 | Ikeda ...................... 437/63 |
| 5,134,085 A | 7/1992 | Gilgen et al. ............. 437/52 |
| 5,306,940 A | 4/1994 | Yamazaki ................. 257/374 |
| 5,334,550 A | 8/1994 | McElroy et al. ........... 437/65 |
| 5,420,061 A | 5/1995 | Manning .................. 437/57 |

* cited by examiner

Primary Examiner—Jerome Jackson, Jr.
(74) Attorney, Agent, or Firm—Schwegman, Lundberg, Woessner & Kluth, P.A.

(57) ABSTRACT

The invention is a method for creating a portion of an integrated circuit on a semiconductor wafer. The invention comprises doping a substrate to form a doped well region having an opposite conductivity type than the substrate. Separate photomasking steps are used to define N-channel and P-channel metal oxide semiconductor (MOS) transistor gates. A trench is formed near the well without using additional masking steps. The trench improves the latch up immunity of the device. The invention is also the apparatus created by the method and comprises a trench positioned in the substrate to interrupt the conduction of minority carriers between two regions of the substrate. Thus, the invention improves latch up immunity without additional process complexity.

61 Claims, 12 Drawing Sheets

APPARATUS IMPROVING LATCHUP IMMUNITY IN A DUAL-POLYSILICON GATE

This application is a continuation of U.S. Ser. No. 08/762,741 filed Dec. 10, 1996, now U.S. Pat. No. 5,801, 423, which is a continuation of Ser. No. 08/390,605 filed Feb. 17, 1995, abandoned, which is a division of Ser. No. 08/106,179 filed Aug. 13, 1993 now U.S. Pat. No. 5,420, 061.

FIELD OF THE INVENTION

The invention relates to semiconductor devices and the fabrication thereof and, more particularly, to isolation and well regions formed in a substrate and the fabrication thereof.

BACKGROUND OF THE INVENTION

In one method of the related art P and N-channel MOS transistors are fabricated in a semiconductor substrate in a dual polysilicon gate process. In a dual polysilicon gate process, N-channel and P-channel gates are defined with separate individual masks, in contrast to a single polysilicon gate process wherein both the N-channel and the P-channel gates are formed using a single photolithographic process. The semiconductor substrate is doped with negative impurity atoms and positive impurity atoms to create negative and positive active regions respectively. These active regions can be thought of as having opposite polarities or opposite conductivities. One of the regions is created in the substrate while the other region is created in a well. The well is formed by doping a portion of the substrate to have a conductivity opposite to that of the original substrate.

FIGS. 1–3 show a cross sectional portion of a semiconductor wafer following process fabrication steps used in a method of the related art to form P- and N-channel MOS transistors. In FIGS. 1–3 an N-well 5 has been created in a P-substrate 10 by conventional fabrication means.

The N-well is a counterpart to the P-substrate in that it functions as a region in which to form P-channel MOS transistors, while the P-substrate functions as a region in which to form N-channel MOS transistors. A P-type region and an N-type region are opposite of each other with respect to energy bands. An N-type region has many electrons in its conduction band, while a P-type region has relatively few electrons in its conduction band; and a P-type region has many holes in its valence band while an N-type region has relatively few holes in its valence band. Micro Chip, A Practical Guide to Semiconductor Processing, by Peter Van Zant and Electronic Principles, third edition, by Albert Paul Malvino are herein incorporated by reference in order to determine a minimal knowledge of someone skilled in the art.

Thick oxide 25 is grown to form field oxide regions to electrically isolate active regions from each other, and a thin gate oxide 30 is grown overlying the active regions. The formation of the thick oxide layer 25 and the gate oxide layer 30 are well known to those skilled in the art.

Referring to FIG. 1, the conventional fabrication means is continued, and a polysilicon layer 31 is masked with photoresist to define an N-channel gate polysilicon and interconnect and an N-well tie. The polysilicon is etched and spacers 33 are formed on opposing sides of the polysilicon remaining after the etch.

The in-process wafer is bombarded with negative ions to form N-type regions in the active regions not covered with polysilicon 31. N-type active regions 35 function as source/drain regions of an N-channel MOS transistor, and polysilicon layer 31 interposed between the regions 35 functions as the gate of the N-channel MOS transistor thus formed. N-type active region 45 is an N-well tie. An N-well tie is a region formed in the surface of the substrate in the N-well region that provides ohmic contact of the N-well to an external supply potential.

In FIG. 2 a second photoresist mask 50 defines P-channel gate polysilicon and interconnect and protects the N-channel gate polysilicon and N-type active regions 35 and 45 previously defined.

In FIG. 3 the polysilicon layer 31 remaining exposed at this juncture are etched. The substrate is now bombarded with positive ions and P-type active regions 60 and 65 are formed in the surface of the substrate. It is important to note that the thick oxide regions 25 also function as masks during both the positive and negative ion bombardments that form the N-channel and P-channel source/drain regions and well/substrate ties.

P-type active regions 60 function as the sources/drain regions of a P-channel MOS transistor. Polysilicon layer 31 interposed between source/drain regions 60 functions as the gate of the P-channel MOS transistor thus formed. P-type active region 65 is a P-substrate tie and provides ohmic contact to the substrate from an external supply potential.

Although it would seem that the N-well tie 45 shown in the cross section comprises two portions, the N-well tie 45 may actually be a continuous ring surrounding the P-channel transistors, and the P-substrate tie 65 may actually be a continuous ring surrounding the N-well 5. In further fabrication steps, contacts (not shown) are formed with the P-substrate tie 65 and the N-well tie 45 as well as the source/drain and gate terminals of the MOS devices. The P-substrate tie 65 is connected to a potential having a low voltage, typically ground, and the N-well tie 45 is connected to a potential having a high voltage, typically $V_{CC}$. The P-substrate tie and N-well tie help prevent latch up of the device when interposed between the N-MOS and P-MOS device.

Latchup occurs when two parasitic cross coupled bipolar transistors are actuated and essentially short a first external supply potential, $V_{CC}$, to a ground potential, $V_{SS}$. When the fabrication of the transistors is completed the N-channel source/drain regions 35 form the emitter, P-substrate 10 forms the base, and the N-well 5 forms the collector of a horizontal parasitic NPN transistor; and the P-channel source/drain regions 60 form the emitter, the N-well 5 forms the base, and the p-substrate 10 forms the collector of a vertical parasitic PNP transistor. The parasitic PNP and NPN bipolar transistors thus formed are actuated by the injection of minority carriers in the bulk of the substrate or the N-well. To prevent latch up, the lifetime of these carriers must be reduced, or the resistance of the substrate must be decreased. The latter method may force compromise in device performance by increasing junction capacitance and body effect.

The N and P substrate ties formed in the related art are gaurdbands which reduce the lifetime of the minority carriers. The gaurdbands act as a sink for the minority carriers that are injected into the substrate or N-well when the emitter/base junction of either parasitic bipolar device is forward biased. The gaurdbands also increase the distance these minority carriers must travel thereby increasing the probability that they will recombine with majority carriers. The gaurdbands are typically formed between the N-channel MOS transistor and the P-channel MOS transistor. The gaurdbands are strips of P+ active regions in the P-substrate and N+ active regions in the N-well. The gaurdbands tie down the substrate and well potentials and prevent latchup by collecting any injected minority carriers from forward biasing the MOS device source or drain regions.

OBJECTS OF THE INVENTION

It is an object of the invention to achieve improved latchup immunity without increasing the complexity of the process steps in a dual-polysilicon process. It is a further object of the invention to reduce the lifetime of the minority carriers, and increase the distance minority carriers must travel to reach a parasitic bipolar collector.

SUMMARY OF THE INVENTION

The invention features a method for forming a trench in an active region of a substrate, and features the trench thus formed. The substrate surface reserved for trench formation is doped to have a first type conductivity. Portions of the substrate are protected, and the substrate is etched in the unprotected areas to form the trench. At the same time the trench is etched a layer overlying the substrate is also etched to form a gate region. Thus, the trench is formed without increasing processing steps. A substrate region at the bottom of the trench is doped to create a substrate region having a second type conductivity. The trench is positioned between a first and second active device and directly in a desired path of the minority carriers. The trench reduces minority current, thereby reducing the possibility of latchup.

In one embodiment of the invention, unannealed damage caused by the trench etch functions as a recombination medium for minority carriers.

In a further embodiment of the invention the trench is filled with polysilicon. The polysilicon functions as a recombination medium.

In addition the polysilicon may function as an electrical interconnect between the doped substrate and an external potential. In this embodiment the polysilicon filled trench is also a substrate tie.

DETAILED DESCRIPTION OF THE INVENTION

The invention is a method for creating a portion of an integrated circuit on a semiconductor wafer. In the method of the invention an isolation trench and an isolation region are formed in order to electrically isolate two regions of the integrated circuit from each other. The isolation trench and the isolation region minimize undesired effects, such as latch up caused by the actuation of parasitic bipolar transistors.

Although the method of the invention pertains to the fabrication of the isolation trench and the isolation region of the integrated circuit, the method will be described in conjunction with the formation of transistors in order to provide a clearer picture of the function of the invention.

Figure 1:
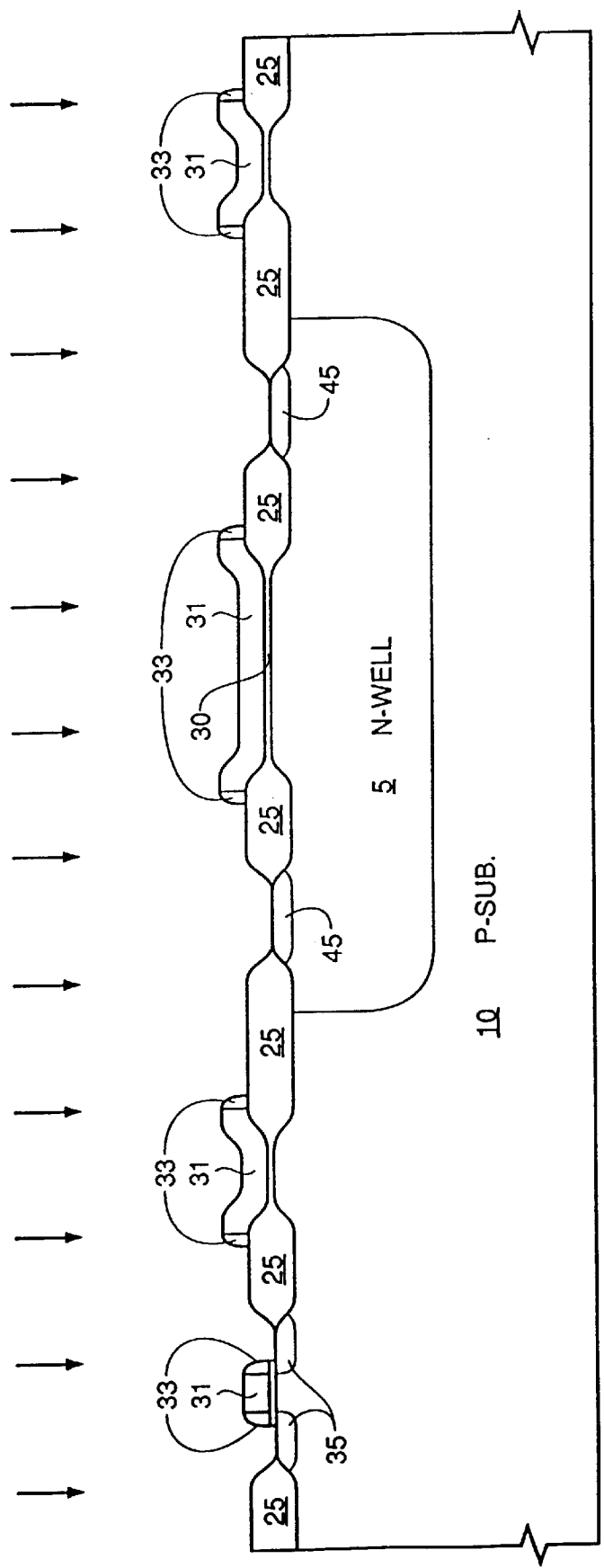
FIG. 1 is a cross section of a portion of a related art semiconductor wafer following the formation of an N-well and N+ active regions.
Figure 2:
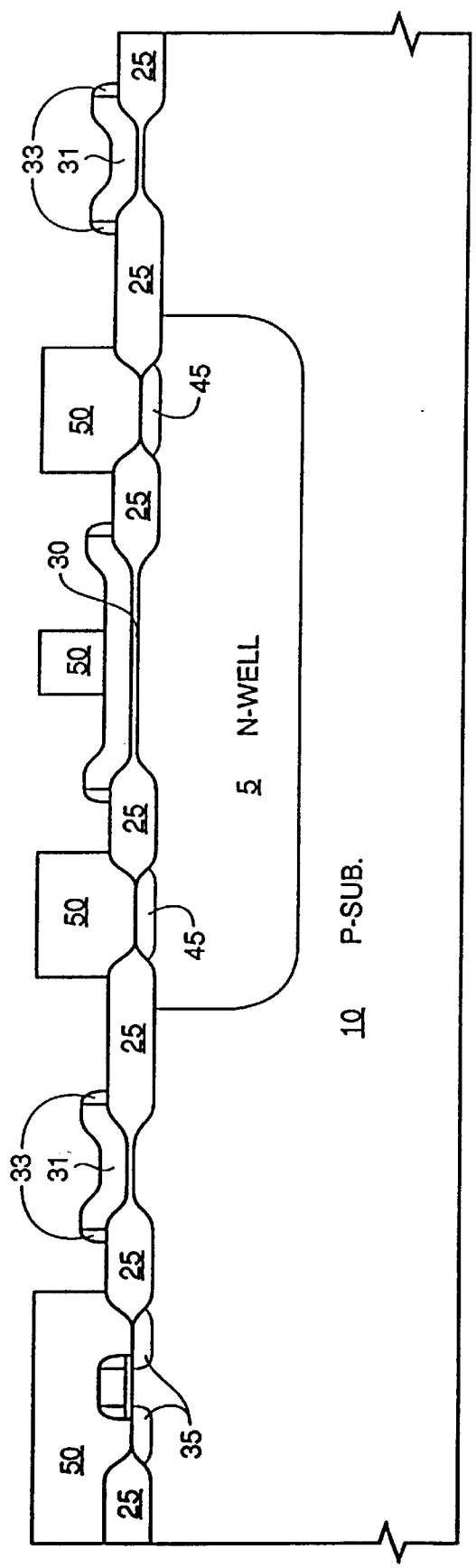
FIG. 2 is a cross section of the related art semiconductor wafer of FIG. 1 following the masking of the N+ regions.
Figure 3:
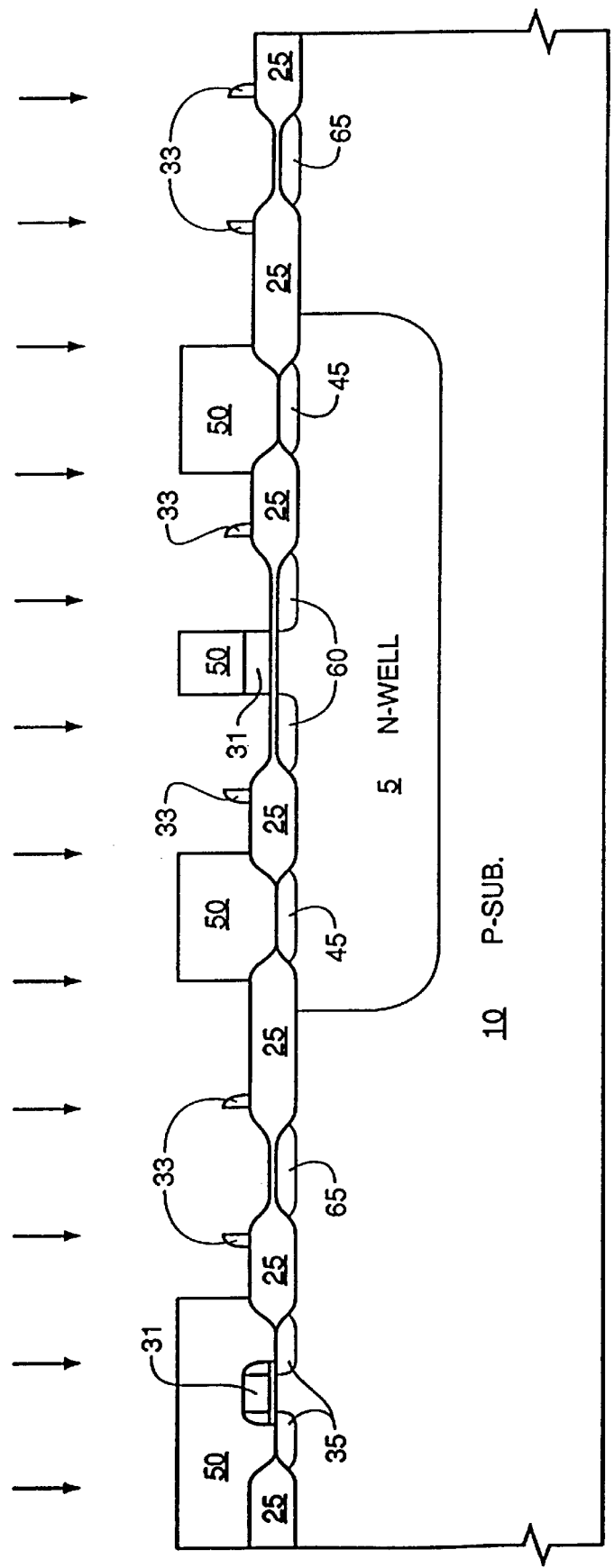
FIG. 3 is a cross section of the related art semiconductor wafer of FIG. 2 following the formation of a P+ active regions.
Figure 4A:
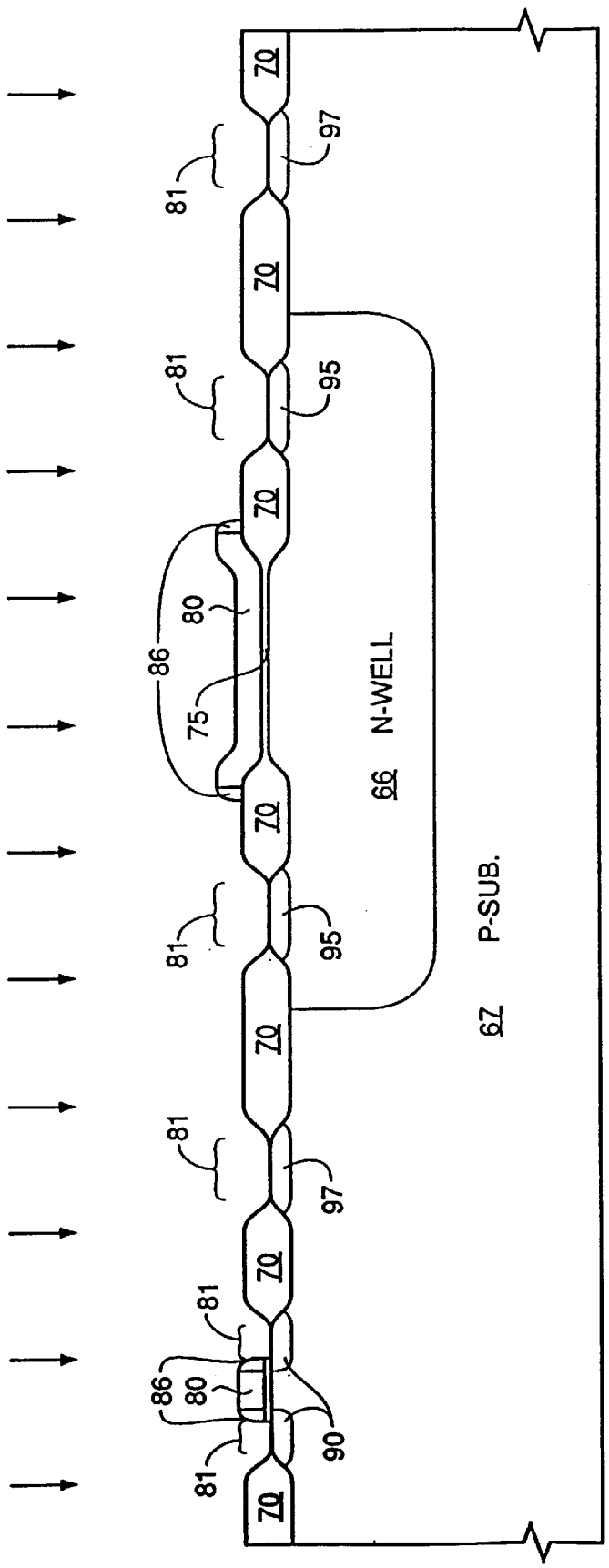
FIGS. 4A–C are cross sections of a portion of a semiconductor wafer of the invention following the formation of N+ regions in the substrate.
Figure 4B:
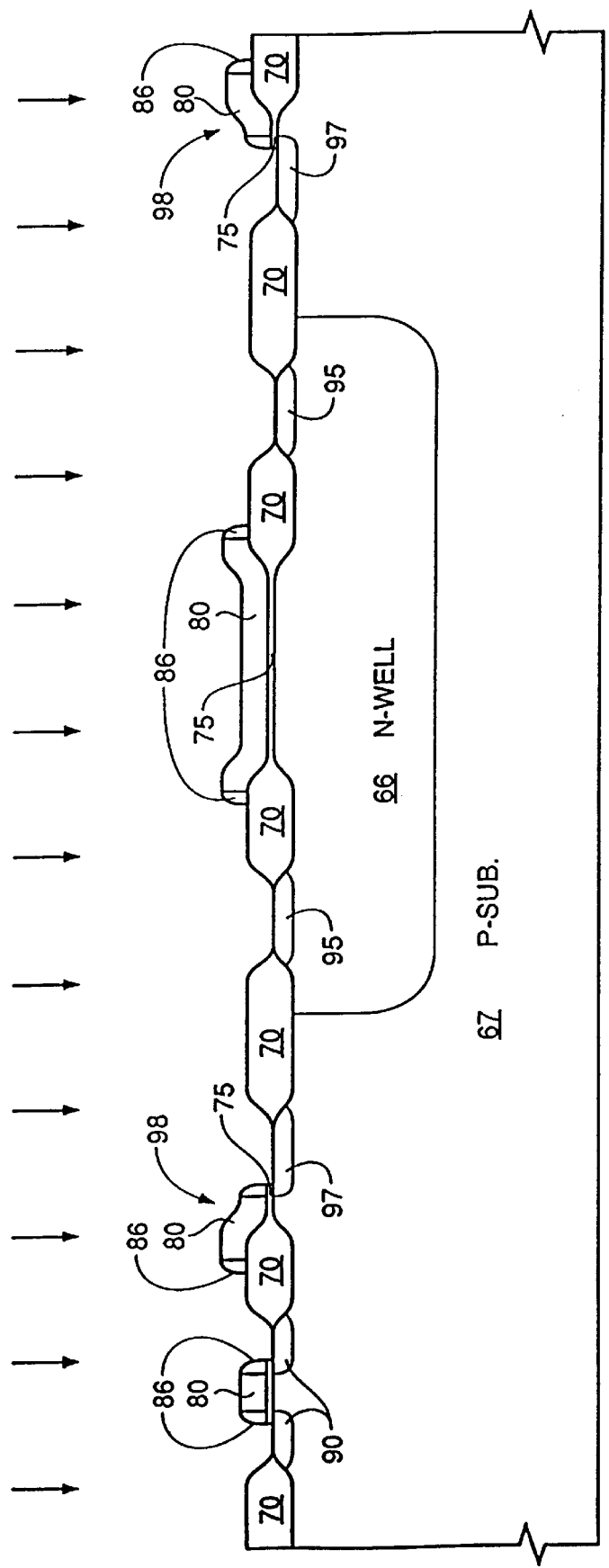
Figure 4C:
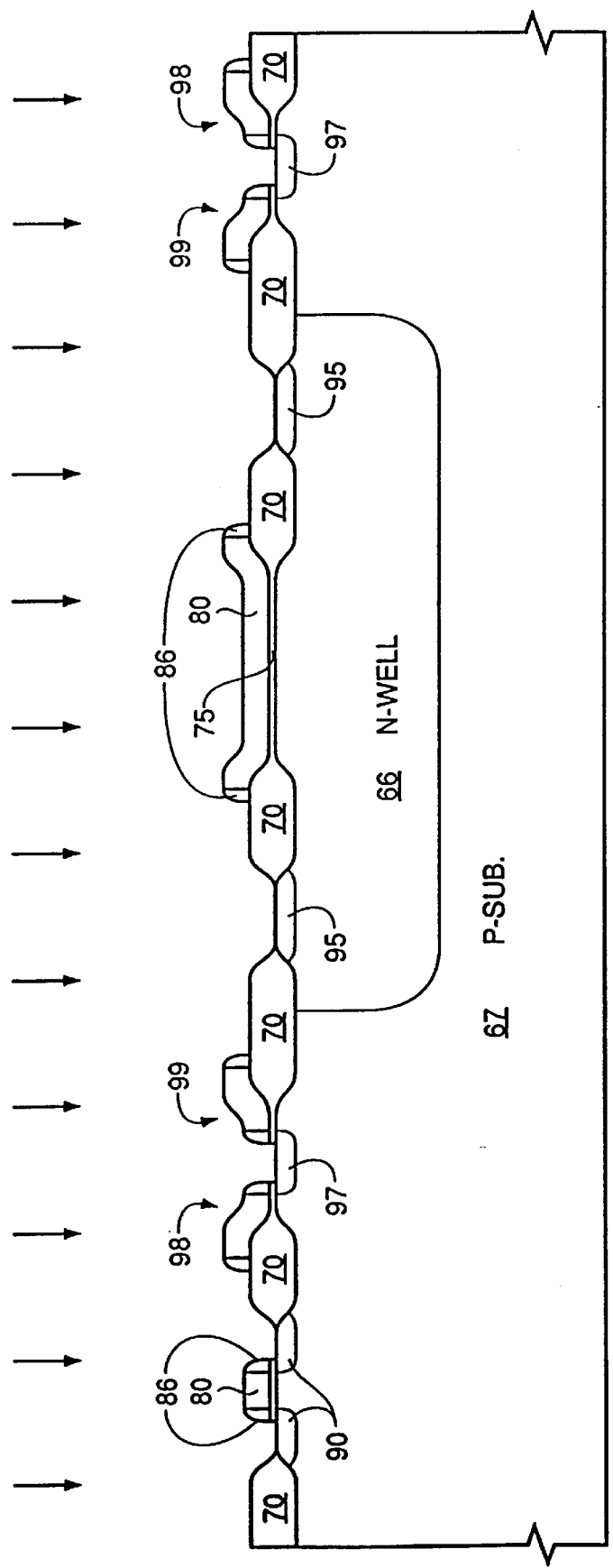

Referring to FIGS. 4A–C, an N-well 66 is formed in a P-substrate 67. Creating an N-well within a P-type substrate is well known to those skilled in the art and involves doping the substrate with impurity atoms to create a negatively doped region in which to fabricate a P-channel metal oxide semiconductor (MOS) transistor. Since a P-type substrate is positively doped the P-type substrate and the N-well can be thought of as having opposite polarities or opposite conductivities.

Still referring to FIGS. 4A–C, the substrate has been patterned and a thick oxide 70 has been formed in isolation regions using a conventional local oxidation of silicon (LOCOS) process. Optionally other isolation schemes, such as trench isolation and poly buffered LOCOS, may be used. These alternate isolation schemes are also well known to those skilled in the art.

Following the removal of the mask used to grow the field oxide, thin gate oxide 75 is formed in future active regions. The creation of thin gate oxide is also well known to those skilled in the art.

Following the formation of the gate oxide 75 a polysilicon layer 80 is deposited. A photoresist mask, not shown, is used to pattern the polysilicon layer 80 thereby exposing a selected first portion of the future active regions. The unprotected portion of the polysilicon is etched exposing gate oxide 75 in the selected first portion of the future active regions. The polysilicon etch also exposes portions of the thick oxide 70. Spacers 86 are created on the opposed exposed ends of the etched polysilicon layer 80. The spacers 86 may be electrically insulative and are created with methods well known to those skilled in the art. The spacers 86 are typically oxide.

Next the substrate is bombarded with ions having a sufficient dose to form highly doped N+ regions in each of the selected first portion of exposed active regions. Typical ions used to fabricate N+ regions are arsenic, antimony, or phosphorous. N+ active regions 90 function as source/drain regions of an N-channel MOS transistor. The gate of the N-channel MOS transistor is the polysilicon layer 80 interposed between the N+ active regions 90. N+ active region 95 is an isolation region which functions as an N-well tie when connected to an external supply potential, such as $V_{CC}$. N+ active region 95 may be a contiguous annular ring. It should be noted that an annular ring is not necessarily circular. N+ active region 97 fabricated during this step will be removed during the formation of a substrate trench. N+ active region 97 may form a contiguous annular ring surrounding the N-well 66 and basically concentric to the annular ring formed by N+ active region 95. The distance between the two regions 95 and 97 may vary due to variations in the width of the thick oxide layer 70 interposed between the two active regions 95 and 97.

In addition to the polysilicon layer 80 with spacers 86, the thick oxide 70 functions as a mask during the ion bombardment.

In FIG. 4B a segment 98 of polysilicon layer 80 with spacers 86 functions as a mask to define active region 97. It can be seen by studying FIG. 4B that segment 98 extends beyond the thick oxide 70 and actually overlies a portion of the gate oxide layer 75. In addition it is possible to use a second segment 99 of polysilicon layer 80 with spacers 86 to mask the other side of active area 97 as shown in FIG. 4C.

During spacer formation, all oxide overlying exposed active regions is typically removed (FIGS. 4A–C), although this is not a requirement of this invention.

Figure 5A:
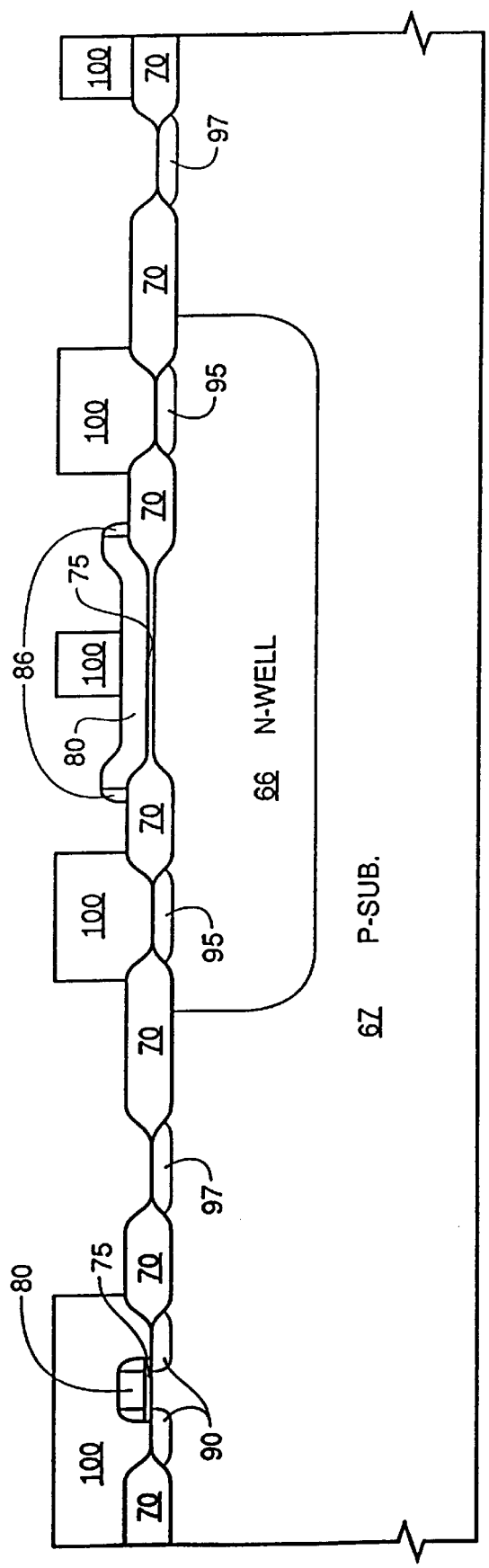
FIGS. 5A–C are cross sections of a portion of the semiconductor wafer of FIGS. 4A and 4B, respectively, following the masking of the substrate to protect selected N+ regions.
Figure 5B:
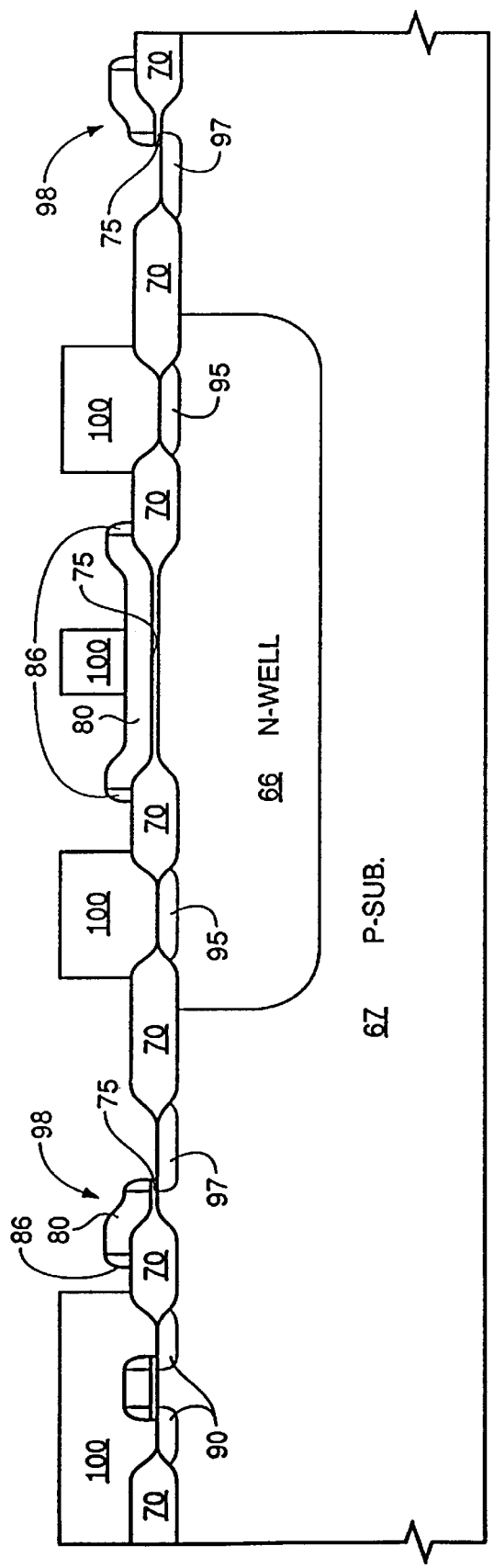
Figure 5C:
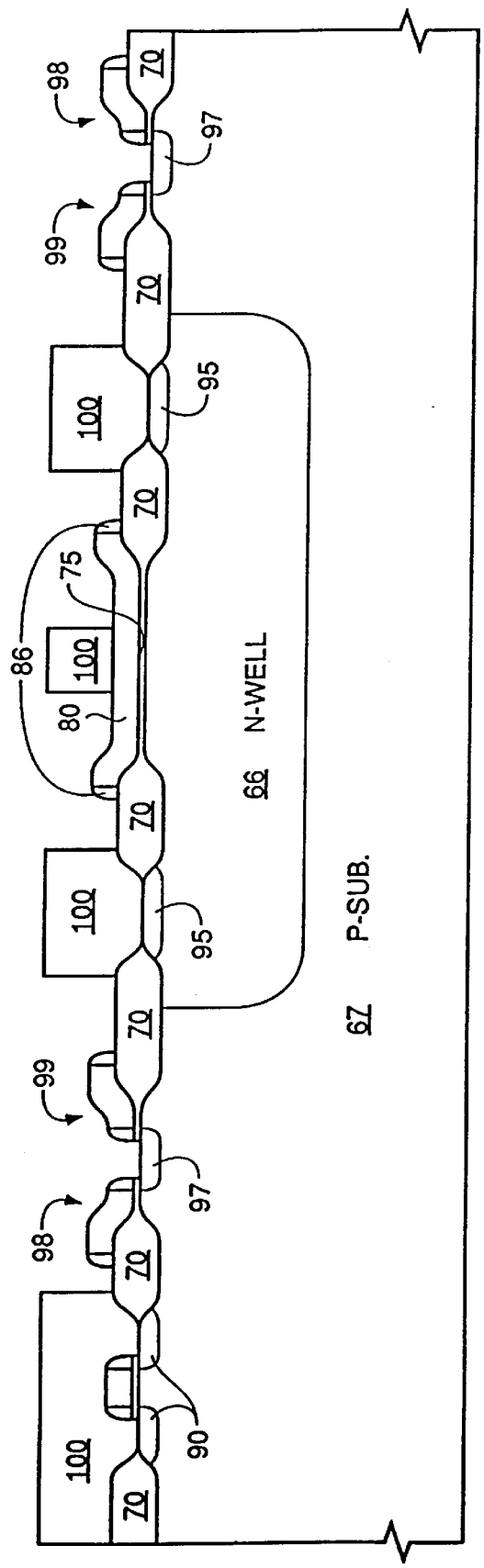

Referring now to FIGS. 5A–C, a photoresist mask 100 is formed to protect the N+ active regions 90 and 95 during the formation of a second portion of active regions. If remaining oxide 75 has not yet been removed from active region 92 it is now removed in exposed areas during a short oxide etch. This oxide etch is selective over the exposed polysilicon 80.

Figure 6A:
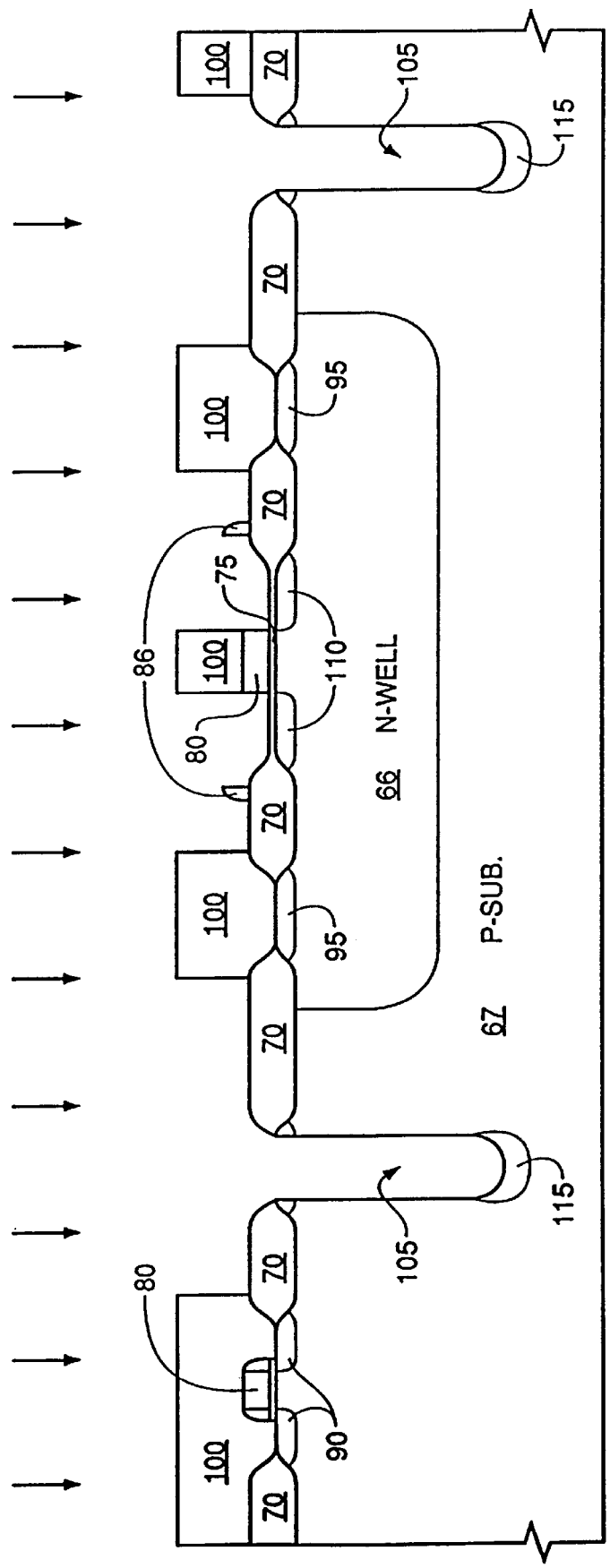
FIGS. 6A–C are cross sections of a portion of the semiconductor wafer of FIGS. 5A and 5B, respectively, following the formation of a trench and P+ regions in the substrate.
Figure 6B:
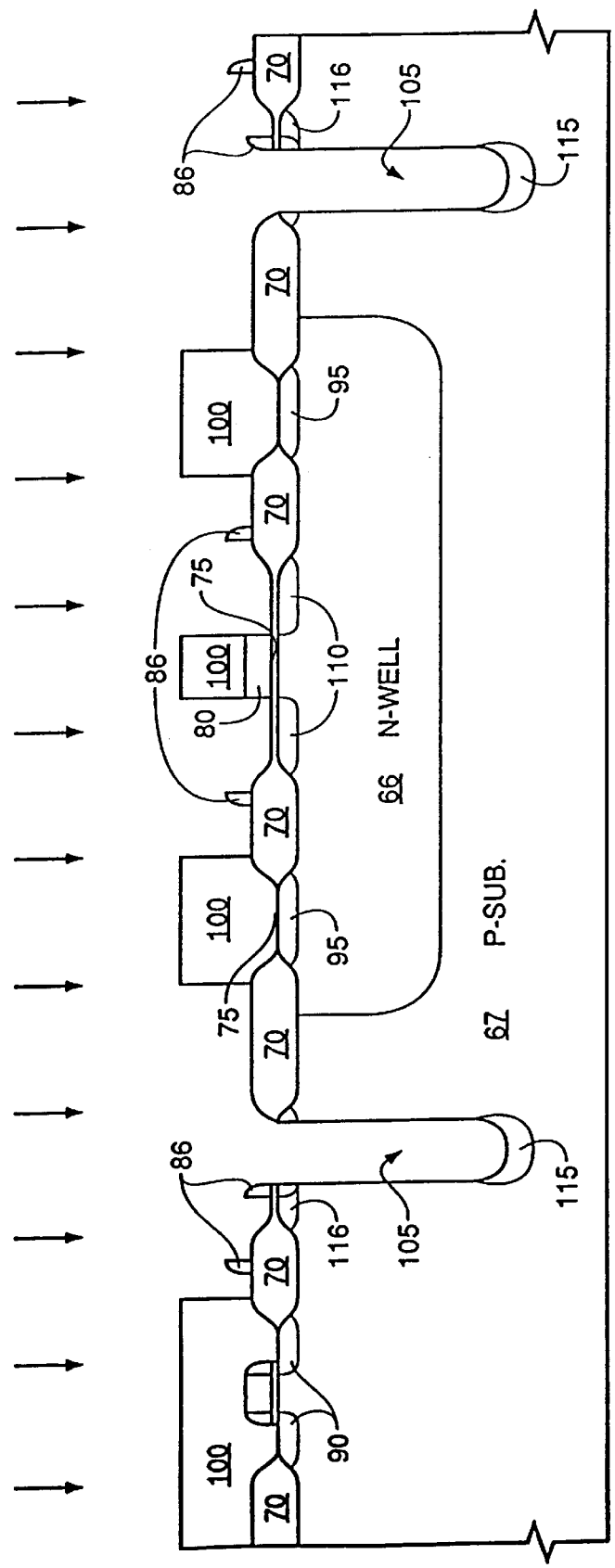
Figure 6C:
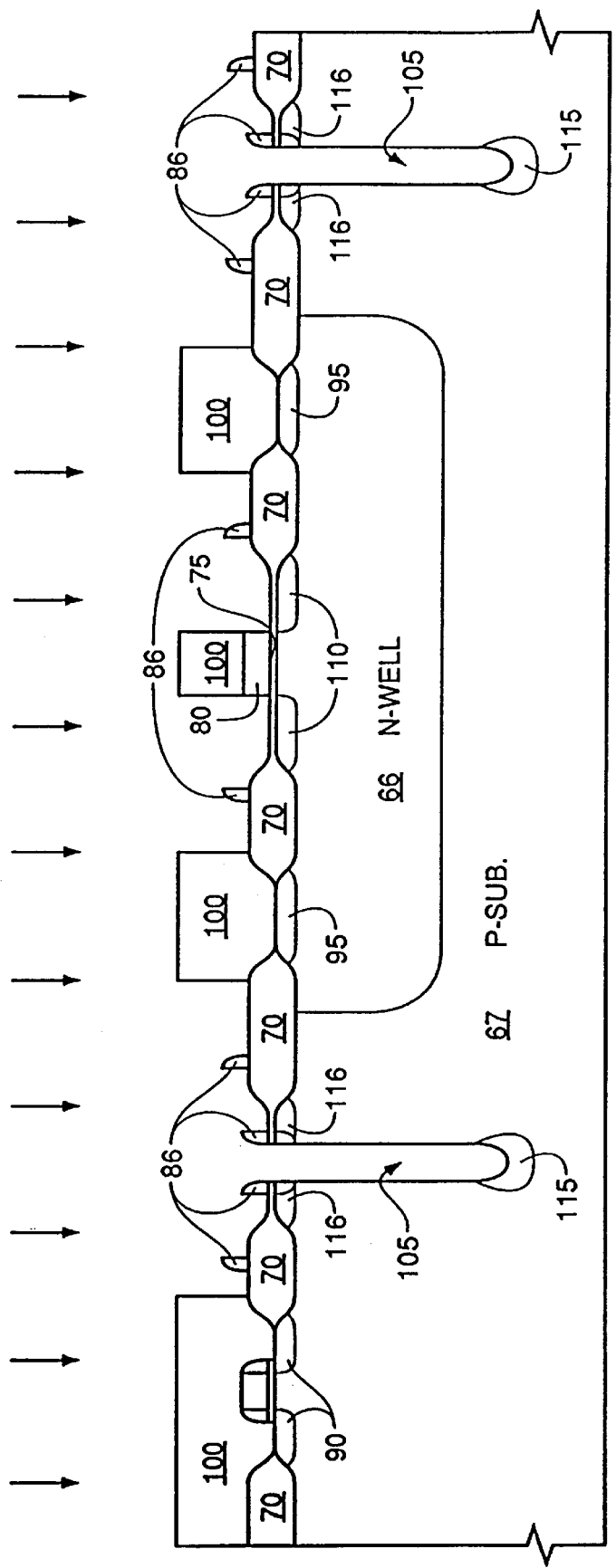

Referring now to FIGS. 6A–C, an etch selective to silicon over oxide is performed to create a trench 105 in the silicon substrate 67. The etch substantially removes the active area 97 to create a recess and then removes the substrate underlying the recess to complete the trench formation. In FIG. 6A the trench 105 is self-aligned to the thick oxide 70. In FIG. 6B the trench 105 is self aligned on one side to the thick oxide 70 and is aligned on the other side to the edge of the spacer 86. In FIG. 6C the trench is aligned on both sides to the edge of the spacers 86. During the etch unmasked portions of polysilicon layer 80, including segments 98 and 99, are also etched. However, the substrate 67 underlying the etched polysilicon layer 80 is protected during the etch by the gate oxide layer 75. In addition, the spacers 86 protect the substrate 67 during the etch. In a preferred embodiment the trench 105 is created to have a depth greater than the depth of the N-well 66.

Following the trench formation the wafer is bombarded with positive ions having a sufficient energy to form highly doped to P+ regions in the unmasked portions of the substrate. Typical ions used during the ion bombardment are aluminum, boron, or gallium. P+ active regions 110 are source/drain regions of a P-channel MOS transistor. The gate of the P-channel MOS transistor is the polysilicon layer 80 interposed between the P+ active regions 110. P+ region 115 is formed in the silicon substrate 67 at the base of the trench 105. The trench 105 with its P+ region 115 and the N+ active region 95 functioning as an N-well tie separate the P-channel MOS transistor from the N-channel MOS transistor thus formed. In FIGS. 6B and 6C an additional P+ active region 116 is formed adjacent to a top portion of the trench. Standard metalization contacts can readily be formed overlying the P+ active region 116.

A P+ region and an N+ region are opposite of each other with respect to energy bands. An N+ region has many electrons in its conduction band, while a P+ region has relatively few electrons in its conduction band; and a P+ region has many holes in its valence band while an N+ region has relatively few holes in its valence band.

Once the trench 105 has been fabricated according to the steps of the invention alternate embodiments may be employed at the discretion of the designer. In one option a high temperature anneal is performed subsequent to the trench formation in order to create regions at the bottom of the trench 105 which have recombination centers even when high temperature anneals are performed later in the fabrication process. These regions function as recombination centers for the minority carriers and further reduce the concentration of the minority carriers in the device.

An additional option comprises filling the trench 105 with polysilicon. The polysilicon provides additional recombination centers. In the present embodiment the polysilicon is either P+ type or undoped.

In a further embodiment the substrate adjacent to the sidewalls of the trench are positively doped. In this embodiment the trench may be filled with polysilicon or a dielectric following the trench etch and sidewall doping. Alternately the substrate adjacent to the sidewalls may be doped automatically during the doping of a previously deposited filler material such as the polysilicon.

In a further embodiment the P+ region 115 may be connected to an external potential having a low voltage, typically ground via polysilicon deposited in the trench. In this case the P+ region 115 is a substrate tie.

In addition the shape of the trench is not important, although one skilled in the art would be aware of the importance of using suitable design rules to prevent shorting the trench to the boundary of the N-well or an adjacent N-channel region.

Although the detailed description has described the formation of one trench 105, the invention is applicable when forming a plurality of trenches.

Although the invention has been described in terms of forming the trench in a P-type substrate with an N-well formed therein, the invention is equally applicable to forming a trench in an N-type substrate with a P-well formed therein and to creating an N-type region at the base of the trench thus formed.

There are many methods that may be employed to dope a substrate in addition to bombarding the substrate with dopant ions. These alternate methods are well known to those skilled in the art. One alternate method is diffusion.

Although the method is more effective when the trench is formed in the substrate rather than the well, the invention can be performed for either case, and in either case the trench is positioned to reduce minority current caused by parasitic bipolar transistors.

No additional mask steps are required in this invention over those typically used in a dual poly gate patterning process. However, the invention is not limited to MOS devices. Other options include using the method and or apparatus of the invention to improve the isolation of bipolar devices one from another.

Although the invention has been described as a dual polysilicon process the method could also be applied to MOS or bipolar process that etch layers of polysilicon doped and patterned at different steps. Such a process could use polysilicon 1 and polysilicon 2 etch steps to form the trench.

While this invention has been described with reference to an illustrative embodiment, this description is not intended to be construed in a limiting sense. Various modifications as well as other embodiments for fabricating a trench in a previously doped active region or for the trench formed therein will be apparent to persons skilled in the art upon reference to this description. It is, therefore contemplated that the appended claims will cover any such modifications or embodiments as fall within the true scope of the invention.

What is claimed is:

1. An integrated circuit, comprising:
   a substrate;
   a first region having a first conductivity type formed in the substrate;
   a second region having a second conductivity type formed in the first region having the first conductivity type;
   a first active device positioned in the first region, the first active device including a first doped active region;
   a second active device positioned in the second region, the second active device including a second doped active region;

a spacer formed on one of the first region and the second region; and a trench disposed from the surface of the substrate in the substrate at a position between the first and second active devices, wherein one side of the trench is aligned with the spacer, wherein the substrate at a base of the trench is defined by a highly doped third region formed in the substrate through the trench, wherein the highly doped third region has a conductivity type selected from the group consisting of the first conductivity type when the trench is disposed in the first region and the second conductivity type when the trench is disposed in the second region, wherein the highly doped third region is doped by a same first dopant of the first doped active region when the highly doped third region is in the first region, wherein the highly doped third region is doped by a same second dopant of the second doped active region when the highly doped third region is in the second region.

2. The integrated circuit of claim 1 wherein the first region having the first conductivity type comprises a P-type conductivity region and the second region having the second conductivity type comprises an N-type conductivity region.

3. The integrated circuit of claim 1 wherein the first and second active devices comprise metal oxide semiconductor transistors.

4. The integrated circuit of claim 1 wherein the trench is disposed in the first region having the first conductivity type and is isolated from regions having the second conductivity type by isolation regions.

5. The integrated circuit of claim 4 wherein the trench has a depth greater than the depth of the second region having the second conductivity type.

6. The integrated circuit of claim 4 further comprising material filling the trench.

7. The integrated circuit of claim 6 wherein the material filling the trench comprises polysilicon.

8. The integrated circuit of claim 7 wherein the polysilicon filling the trench comprises polysilicon doped to have the first conductivity type.

9. The integrated circuit of claim 4 further comprising a fourth region having the first conductivity type positioned adjacent to a top portion of the trench.

10. The integrated circuit of claim 9 further comprising material filling the trench, wherein the material is selected from the group consisting of doped polysilicon, undoped polysilicon and a dielectric.

11. The integrated circuit of claim 9 further comprising contacts formed overlying the fourth region having the first conductivity type.

12. The integrated circuit of claim 4 wherein the third region having the first conductivity type is connected to an external potential having a low voltage.

13. The integrated circuit of claim 12 wherein the external potential having a low voltage is a ground.

14. The integrated circuit of claim 12 wherein the connection to an external potential having a low voltage is via material deposited in the trench.

15. The integrated circuit of claim 1 wherein the trench comprises a contiguous annular ring surrounding the second active device.

16. The integrated circuit of claim 1 wherein the trench is disposed in the second region having the second conductivity type and is isolated from regions having the first conductivity type by isolation regions.

17. The integrated circuit of claim 16 further comprising material filling the trench.

18. The integrated circuit of claim 17 wherein the material filling the trench comprises polysilicon.

19. The integrated circuit of claim 18 wherein the polysilicon filling the trench comprises polysilicon doped to have the second conductivity type.

20. The integrated circuit of claim 16 further comprising a fourth region having the second conductivity type formed adjacent to a top portion of the trench.

21. The integrated circuit of claim 20 further comprising material filling the trench, wherein the material is selected from the group consisting of doped polysilicon, undoped polysilicon and a dielectric.

22. The integrated circuit of claim 20 further comprising contacts formed overlying the fourth region having the second conductivity type.

23. The integrated circuit of claim 16 wherein the third region having the second conductivity type is connected to an external potential having a high voltage.

24. The integrated circuit of claim 23 wherein the external potential having a high voltage is $V_{cc}$.

25. The integrated circuit of claim 23 wherein the connection to an external potential having a high voltage is via material deposited in the trench.

26. An integrated circuit, comprising:
a substrate;
a first doped region of the substrate, wherein the first doped region has a first conductivity type;
a second doped region of the substrate, wherein the second doped region has a second conductivity type;
a first active device positioned in the first doped region, the first active device including a doped active region;
a second active device positioned in the second doped region;
a spacer formed on the substrate; and
a trench disposed from the surface of the substrate in the first doped region at a position between the first and second active devices, wherein one side of the trench is aligned with the spacer, wherein the substrate at a base of the trench includes a third doped region having the first conductivity type, wherein the third doped region is formed in the first doped region through the trench and is more highly doped than the first doped region, and wherein the third doped region is doped by a same dopant as the doped active region.

27. The integrated circuit of claim 26 wherein the first doped region comprises a P-type conductivity region and the second doped region comprises an N-type conductivity region.

28. The integrated circuit of claim 26 wherein the second doped region comprises a well within the first doped region.

29. The integrated circuit of claim 26 wherein the first and second active devices comprise metal oxide semiconductor transistors.

30. The integrated circuit of claim 26 wherein the trench has a depth greater than the depth of the second doped region.

31. The integrated circuit of claim 26 further comprising a fourth doped region having the first conductivity type positioned adjacent to a top portion of the trench.

32. The integrated circuit of claim 31 wherein the fourth doped region having the first conductivity type is more highly doped than the first doped region having the first conductivity type.

33. The integrated circuit of claim 31 further comprising contacts formed overlying the fourth doped region.

34. The integrated circuit of claim 26 further comprising material filling the trench wherein the material is selected from the group consisting of doped polysilicon, undoped polysilicon and a dielectric.

35. The integrated circuit of claim 26 wherein the third doped region is connected to an external potential having a low voltage.

36. The integrated circuit of claim 26 wherein the trench comprises a contiguous annular ring surrounding the second doped region.

37. An integrated circuit, comprising:
a substrate;
a first doped region of the substrate, wherein the first doped region has a first conductivity type;
a second doped region of the substrate, wherein the second doped region has a second conductivity type, further wherein the second conductivity type is opposite the first conductivity type, still further wherein the second doped region forms a well within the first doped region;
a first active device positioned in the first doped region, wherein the first active device is a metal oxide semiconductor device having the second conductivity type and an active region;
a second active device positioned in the second doped region, wherein the second active device is a metal oxide semiconductor device having the first conductivity type;
a spacer formed on the substrate;
a trench disposed from the surface of the substrate in the first doped region at a position between the first and second active devices, wherein one side of the trench is aligned with the spacer, wherein the trench is isolated from doped regions having the second conductivity type by isolation regions; and
a third doped region positioned in the substrate at a base of the trench, wherein the third doped region has the first conductivity type, further wherein the third doped region is more highly doped than the first doped region, still further wherein the third doped region is formed in the first doped region in the substrate with a same dopant that dopes the active region.

38. The integrated circuit of claim 37 wherein the first doped region comprises a P-type conductivity region and the second doped region comprises an N-type conductivity region.

39. The integrated circuit of claim 37 wherein the first doped region comprises an N-type conductivity region and the second doped region comprises a P-type conductivity region.

40. The integrated circuit of claim 37 wherein the trench has a depth greater than the depth of the second doped region.

41. The integrated circuit of claim 37 further comprising a fourth doped region having the first conductivity type positioned adjacent to a top portion of the trench, wherein the fourth doped region is more highly doped than the first doped region.

42. The integrated circuit of claim 41 further comprising contacts formed overlying the fourth doped region.

43. The integrated circuit of claim 37 further comprising material filling the trench wherein the material is selected from the group consisting of doped polysilicon, undoped polysilicon and a dielectric.

44. The integrated circuit of claim 37 wherein the third doped region is connected to an external potential having a low voltage.

45. The integrated circuit of claim 37 wherein the trench comprises a contiguous annular ring surrounding the second doped region.

46. An integrated circuit, comprising:
a substrate;
a first region having a first conductivity type formed in the substrate, wherein the first conductivity type is selected from the group consisting of P-type and N-type;
a second region having a second conductivity type formed in the first region having the first conductivity type, wherein the second conductivity type is N-type when the first conductivity type is P-type and the second conductivity type is P-type when the first conductivity type is N-type;
a first active device positioned in the first region, the first active device including an active region;
a second active device position in the second region;
a spacer formed on the substrate; and
a trench disposed from the surface of the substrate in the substrate at a position in the first region between the first and second active devices, wherein one side of the trench is aligned with the spacer, wherein the substrate at a base of the trench includes a highly doped third region implanted in the substrate through the trench with a same dopant that dopes the active region of the first active device, wherein the highly doped third region has the first conductivity type.

47. The integrated circuit of claim 4 wherein the trench has a depth greater than the depth of the second region having the second conductivity type.

48. The integrated circuit of claim 46 wherein the third region having the first conductivity type is more highly doped than the first region having the first conductivity type.

49. The integrated circuit of claim 46 wherein the trench is filled with polysilicon doped to have the first conductivity type.

50. The integrated circuit of claim 46 further comprising a fourth region having the first conductivity type positioned adjacent to a top portion of the trench.

51. The integrated circuit of claim 46 wherein the trench comprises a contiguous annular ring surrounding the second active device.

52. An integrated circuit, comprising:
a substrate;
a first region having a first conductivity type formed in the substrate, wherein the first conductivity type is selected from the group consisting of P-type and N-type;
a second region having a second conductivity type formed in the first region having the first conductivity type, wherein the second conductivity type is N-type when the first conductivity type is P-type and the second conductivity type is P-type when the first conductivity type is N-type;
a first active device positioned in the first region;
a second active device positioned in the second region, the second active device including an active region;
a spacer formed on the substrate; and
a trench disposed from the surface of the substrate at a position in the second region between the first and second active devices, wherein one side of the trench is aligned with the spacer, wherein the substrate at a base of the trench includes a highly doped third region implanted int he substrate through the trench with a same dopant that dopes the active region of the second active device, wherein the highly doped third region has the second conductivity type.

53. The integrated circuit of claim 52 wherein the third region having the second conductivity type is more highly doped than the second region having the second conductivity type.

54. The integrated circuit of claim 52 wherein the trench is filled with polysilicon doped to have the second conductivity type.

55. The integrated circuit of claim 52 further comprising a fourth region having the second conductivity type positioned adjacent to a top portion of the trench.

56. The integrated circuit of claim 52 wherein the trench comprises a contiguous annular ring surrounding the second active device.

57. An integrated circuit, comprising:
a substrate;
a first region having a first conductivity type formed in the substrate, wherein the first conductivity type is selected from the group consisting of P-type and N-type;
a second region having a second conductivity type formed in the first region, wherein the second conductivity type is N-type when the first conductivity type is P-type and the second conductivity type is P-type when the first conductivity type is N-type;
a first active device positioned in the first region, the first active device including an active region;
a second active device positioned in the second region;
a spacer formed on the substrate; and
a trench disposed from the surface of the substrate in the first region comprising a contiguous annular ring surrounding the second active device and having a depth greater than a depth of the second region, wherein a portion of the trench is aligned with the spacer, wherein the substrate at a base of the trench includes a highly doped third region implanted in the substrate through the trench with a same dopant that dopes the active region of the first active device, wherein the highly doped third region has the first conductivity type and is more highly doped than the first region.

58. An integrated circuit, comprising:
a substrate;
a first region having a first conductivity type formed in the substrate, wherein the first conductivity type is selected from the group consisting of P-type and N-type;
a second region having a second conductivity type formed in the first region, wherein the second conductivity type is N-type when the first conductivity type is P-type and the second conductivity type is P-type when the first conductivity type is N-type;
a first active device positioned in the first region;
a second active device positioned in the second region, the second active device including a device active region;
a spacer formed on the substrate; and
a trench disposed from the surface of the substrate in the second region comprising a contiguous annular ring surrounding the second active device, wherein a portion of the trench is aligned with the spacer, wherein the substrate at a base of the trench includes a highly doped third region implanted in the substrate through the trench with a same dopant that dopes the active region of the second active device, wherein the highly doped third region has the second conductivity type and is more highly doped than the second region.

59. An integrated circuit, comprising:
a subtrate;
a first region having a first conductivity type is formed in the substrate;
a second region having a second conductivity type formed in the first region having the first conductivity type;
a first active device positioned in the first region, the first active device including a first active region;
a second active device positioned in the second region, the second active device including a second active region;
a spacer formed on the substrate; and
a trench disposed from the surface of the substrate in the substrate at a position between the first and second active devices, wherein one side of the trench is aligned with the spacer, wherein the substrate at a base of the trench is defined by a highly doped third region formed in the substrate through the trench, wherein the highly doped third region has a conductivity type selected from the group consisting of the first conductivity type when the trench is disposed in the first region and the second conductivity type when the trench is disposed in the second region,
wherein the highly doped third region is doped by a same first dopant as the first active region when the highly doped third region is in the first region,
wherein the highly doped third region is doped by a same second dopant as the second doped active region when the highly doped third region is in the second region,
wherein the highly doped third region is formed simultaneously with one of the first active region and the second active region.

60. An integrated circuit, comprising:
a substrate;
a first region having a first conductivity type formed in the substrate;
a second region having a second conductivity type formed in the first region having the first conductivity type;
a first active device positioned in the first region;
a second active device positioned in the second region;
a spacer formed on the substrate; and
a trench disposed from the surface of the substrate in the substrate at a position between the first and second active devices, wherein one side of the trench is aligned with the spacer, wherein the substrate at a base of the trench is defined by a highly doped third region formed in the substrate through the trench, wherein the highly doped third region has a conductivity type selected from the group consisting of the first conductivity type when the trench is disposed in the first region and the second conductivity type when the trench is disposed in the second region, and wherein an undoped material fills the trench.

61. The integrated circuit of claim 60, wherein the undoped material filling the trench includes polysilicon.

* * * * *

UNITED STATES PATENT AND TRADEMARK OFFICE
CERTIFICATE OF CORRECTION

PATENT NO. : 6,445,044 B2
DATED : September 3, 2002
INVENTOR(S) : H. Montgomery Manning It is certified that error appears in the above-identified patent and that said Letters Patent is hereby corrected as shown below:

Column 10,
Line 24, delete "claim 4" and insert -- claim 46 --, therefor.
Line 60, delete "int he" and insert -- in the --, therefor.

Column 11,
Line 49, delete "device" (next to "a") and insert -- doped --, therefor.

Column 12,
Line 3, delete "is" after "type".

Signed and Sealed this

Eleventh Day of March, 2003

JAMES E. ROGAN
*Director of the United States Patent and Trademark Office*

UNITED STATES PATENT AND TRADEMARK OFFICE
CERTIFICATE OF CORRECTION

PATENT NO.    : 6,445,044 B2
DATED         : September 3, 2002
INVENTOR(S)   : H. Montgomery Manning It is certified that error appears in the above-identified patent and that said Letters Patent is hereby corrected as shown below:

<u>Title page, Item [54] and Column 1, lines 1-3,</u>
In the title delete "APPARATUS IMPROVING LATCHUP IMMUNITY IN A DUAL-POLYSILICON GATE" and insert -- APPARATUS FOR IMPROVING LATCHUP IMMUNITY IN A DUAL-POLYSILICON GATE PROCESS --, therefor.

Signed and Sealed this

Twenty-ninth Day of July, 2003

JAMES E. ROGAN
*Director of the United States Patent and Trademark Office*